United States Patent [19]

Kelly

[11] Patent Number: 5,401,996
[45] Date of Patent: Mar. 28, 1995

[54] OVERVOLTAGE PROTECTED SEMICONDUCTOR SWITCH

[75] Inventor: Brendan P. Kelly, Stockport, England

[73] Assignee: U.S. Philips Corporation, New York, N.Y.

[21] Appl. No.: 159,756

[22] Filed: Nov. 30, 1993

Related U.S. Application Data

[63] Continuation of Ser. No. 916,570, Jul. 20, 1992, abandoned.

[30] Foreign Application Priority Data

Jul. 19, 1991 [GB] United Kingdom ............... 9115699
Apr. 9, 1992 [GB] United Kingdom ............... 9207869

[51] Int. Cl.⁶ ...................... H01L 29/78; H01L 29/90
[52] U.S. Cl. ................................ 257/360; 257/140; 257/357; 257/546; 257/547
[58] Field of Search ............... 257/262, 341, 367, 546, 257/547, 355-363, 140, 328, 329, 339, 360

[56] References Cited

U.S. PATENT DOCUMENTS

| | | | |
|---|---|---|---|
| 3,934,159 | 1/1976 | Nomiya et al. | 257/356 |
| 4,037,140 | 7/1977 | Eaton, Jr. | 257/360 |
| 4,161,741 | 7/1979 | Collet et al. | 257/262 |
| 4,580,063 | 4/1986 | Torelli et al. | 257/360 |
| 4,626,882 | 12/1986 | Cottrell et al. | 257/357 |
| 4,829,350 | 5/1989 | Miller | 257/357 |
| 4,858,055 | 8/1989 | Okitaka | 257/360 |
| 4,893,158 | 1/1990 | Mihara et al. | 257/341 |
| 5,005,061 | 4/1991 | Robb et al. | 257/262 |
| 5,023,692 | 6/1991 | Wodarczyk et al. | 257/341 |
| 5,119,153 | 6/1992 | Korman et al. | 257/341 |
| 5,135,880 | 8/1992 | Fisher et al. | 437/44 |
| 5,136,349 | 8/1992 | Yiliyaz et al. | 257/341 |
| 5,162,966 | 11/1992 | Fujihira | 257/360 |

FOREIGN PATENT DOCUMENTS 0372820 6/1990 European Pat. Off.
3936544 6/1990 Germany ............... 257/355
59-207653 11/1984 Japan ............... 257/356
1262667 10/1989 Japan

OTHER PUBLICATIONS

"Self Thermal Protecting Power MOSFET's" Tsuzuki et al, 18th Annual IEEE Power Electronics Specialists Conference 1987, pp. 31-36.

Primary Examiner—Mahshidd Saadat
Attorney, Agent, or Firm—Paul R. Miller

[57] ABSTRACT

An overvoltage protected switch (1) includes a power semiconductor device (10) formed by a plurality of second regions (11) within a first region (3) of a semiconductor body (2), and an insulated gate 12 overlying a conduction channel region (13) between each second region (11) and the first region (3) with the first and second regions (3 and 11) providing a conductive path to first and second main electrodes (4 and 5), respectively, of the switch (1). An auxiliary semiconductor device (100) is formed by a number of further second regions (11), less than the plurality of second regions (11), and a further insulated gate (120) overlying a further conduction channel region (13) between each further second region (11) and the first region (3). A further conductive path connects the further second region (11) to the insulated gate (12) of the power semiconductor device (10) and a diode arrangement (30) connects the insulated gate (120) of the auxiliary semiconductor device (100) to the first main electrode (4) for causing the auxiliary semiconductor device (100) to conduct to supply a signal via the further inductive path to the insulated gate (12) of the power semiconductor device (10) to switch the power semiconductor device (10) on when the voltage on the first main electrode (4) exceeds the predetermined value. The auxiliary semiconductor device (100) thus has a large current-handling capability enabling rapid turn-on of the power device (10) in the event of an overvoltage.

18 Claims, 4 Drawing Sheets

OVERVOLTAGE PROTECTED SEMICONDUCTOR SWITCH

This is a continuation of application Ser. No. 07/916,570, filed Jul. 20, 1992, now abandoned.

FIELD OF THE INVENTION

This invention relates to an overvoltage protected semiconductor switch.

In particular, this invention is concerned with an overvoltage protected semiconductor switch comprising a semiconductor body having a first region of one conductivity type adjacent one major surface, a power semiconductor device comprising a plurality of second regions formed within the first region, an insulated gate overlying a conduction channel region between each second region and the first region with the first and second regions providing conductive path to first and second main electrodes, respectively, of the power semiconductor device, and protective means for applying a signal to the insulated gate of the power semiconductor device to turn the power semiconductor device on when a voltage exceeding a predetermined value is present on the first main electrode.

BACKGROUND OF THE INVENTION

EP-A-372820 discusses such overvoltage protected switches. In particular EP-A-372820 discusses the use of clamping diodes to protect power MOSFETs used, for example, to switch inductive loads. EP-A-372820 describes the previous use of a clamping diode connected externally between the gate and drain (the first main electrode in this case) of a power MOSFET and having an avalanche voltage about two to three volts less than the avalanche voltage of the power MOSFET so that when the drain voltage rises while the power MOSFET is switched off (for example as may occur when switching off an inductive load) and exceeds the avalanche voltage of the clamping diode, the resulting avalanche current causes the gate voltage of the power MOSFET to rise to switch on the power MOSFET and so allow at least part of the energy to be dissipated by conduction of the power MOSFET, thereby avoiding potentially destructive avalanche conditions within the power MOSFET. As an alternative to an externally connected clamping diode, EP-A-372820 proposes the use of a chain of polycrystalline silicon diodes to form the clamping diode. This has the advantage that the polycrystalline silicon diodes can be provided on top of the power MOSFET so that the use of an externally connected diode is avoided. In addition, by providing back-to-back polycrystalline silicon diodes a temperature compensation effect can be achieved. However, the properties of polycrystalline silicon diodes can be very variable and their current-handling capabilities are limited.

It is an aim of the present invention to provide an overvoltage protected switch in which the protective means can be integrated with the power semiconductor device to be protected.

SUMMARY OF THE INVENTION

According to the present invention, there is provided an overvoltage protected semiconductor switch comprising a semiconductor body having a first region of one conductivity type adjacent one major surface, a power semiconductor device comprising a plurality of second regions formed within the first region, an insulated gate overlying a conduction channel region between each second region and the first region with the first and second regions providing a conductive path to first and second main electrodes, respectively, of the power semiconductor device, and protective means for applying a signal to the insulated gate of the power semiconductor, device to turn the power semiconductor device on when a voltage exceeding a predetermined value is present on the first main electrode, characterised in that the protective means comprises an auxiliary semiconductor device comprising a number of further second regions, less than the plurality of second regions, formed within the first region, a further insulated gate overlying a further conduction channel region between each further second region and the first region, a further conductive path connecting the further second regions to the insulated gate of the power semiconductor device and diode means connecting the insulated gate of the auxiliary semiconductor device to the first main electrode for causing the auxiliary semiconductor device to conduct to supply a signal via the further conductive path to the insulated gate of the power semiconductor device to switch the power semiconductor device on when the voltage at the first main electrode exceeds the predetermined value.

Thus, in a protected switch in accordance with the invention, an auxiliary semiconductor device formed at the same time as the power semiconductor device by a number of the same type of cells or second regions used in the power semiconductor device is used to provide the protective means which causes the power semiconductor device to be switched on when an overvoltage occurs on the first main electrode. Being formed of cells comprising the second regions similar to the power semiconductor device, the auxiliary semiconductor device has a large current-handling capability. Accordingly when an overvoltage occurs on the first main electrode, the auxiliary semiconductor device can supply a larger current to the insulated gate of the power semiconductor device enabling the voltage on the insulated gate to be raised quickly so ensuring that the power semiconductor device is rapidly turned on in the event of such an overvoltage so as to avoid the possibility of avalanche-stress induced failure of the power semiconductor device.

In contrast to EP-A-372820 the diode means are here used to effect turn on of the auxiliary semiconductor device and do not need to have a large current-handling capacity because the main current supply to the insulated gate of the power semiconductor device is by means of the auxiliary semiconductor device, once the auxiliary semiconductor device has been turned on by avalanche of the diode means.

The diode means may comprise a series of zener diodes connected between the insulated gate of the auxiliary semiconductor device and the first main electrode. The diode means could comprise a chain or series of polycrystalline silicon diodes similar to those used in EP-A-372820. However in a preferred example the diodes are formed as diffused zener diodes provided within the first region. These zener diodes may be formed by, with appropriate mask modification where necessary, using the implantations and/or diffusions already used to form the power semiconductor device so that no additional steps are necessary to enable formation of the diode means.

Each second region may comprise a region of one conductivity type formed within a respective third region of the opposite conductivity type with each third region and the associated second region defining therebetween a respective conduction channel region. In such a case the second and third regions may be autoaligned to the insulated gage to form a so-called DMOSFET structure.

Each third region may have a more highly doped central region to inhibit parasitic bipolar action. In such a case, the process step used to form the central regions may also be used to form the opposite conductivity type regions of the zener diodes while the process step used to form the second regions may, for example, be used to form the one conductivity type regions of the zener diodes, with appropriate mask modification, if necessary.

A capacitor may be connected in parallel with the diode means between the insulated gate of the auxiliary semiconductor device and the first main electrode so as to provide an initial flow of current to the insulated gate of the auxiliary semiconductor device when the voltage on the first main electrode starts to rise rapidly but has not yet reached the avalanche voltage of the diode means. Such an arrangement should increase the speed of turn on of the auxiliary semiconductor device and thus also the speed of turn on of the power semiconductor device when a voltage above the predetermined value (that is an overvoltage) is present on the first main electrode.

The further conductive path preferably includes further diode means connected between the further second regions and the insulated gate of the power semiconductor device for inhibiting conduction in the reverse direction from the insulated gate of the power semiconductor device to the auxiliary semiconductor device. Such an arrangement acts to ensure that during normal operation of the power semiconductor device a voltage applied to its insulated gate will rapidly turn on the power semiconductor device in the normal manner.

The further diode means may comprise a further series of zener diodes similar to those described above. As an alternative, the further diode means may comprise a diode-connected insulated gate field effect device. In such a case, the diode-connected insulated gate field effect device may comprise a number of parallel-connected insulated gate field effect transistors formed within a well of the opposite conductivity type provided within the first region. This should improve the current-handling capability of the further diode means.

Another zener diode may be provided between the insulated gate and the second region of the power semiconductor device so as to enable the voltage on the insulated gate of the power semiconductor device to fall below the voltage at the second region without turning on any inherent parasitic bipolar structures.

The protective means may further comprise a further insulated gate field effect device connected between the gate electrode of the auxiliary semiconductor device and the first electrode of the power semiconductor device and a RC network for causing the further insulated gate field effect device to turn on when the rate of change of the voltage at the first electrode of the power semiconductor device exceeds a predetermined limit.

In a first example, the further insulated gate field effect device may comprise a further auxiliary semiconductor device comprising a number of additional second regions less than the number of further second regions of the auxiliary semiconductor device and an additional insulated gate overlying a conduction channel region between each additional second region and the first region and a conductive path connecting the additional second regions to the further insulated gate of the auxiliary semiconductor device. This should allow the power semiconductor device to be turned on when the rate of change of the voltage at the power semiconductor device first electrode exceeds a predetermined limit even when the actual step or change in the voltage is quite small. Also the minimum voltage step required to initiate turn on when this predetermined limit is exceeded should be relatively independent of the actual value of the selected limit.

In a second example, the further insulated gate field effect device may comprise an insulated gate field effect transistor (IGFET) of the opposite conductivity type to the power semiconductor device, for example a p-channel device where the power semiconductor device is a n channel device, and the RC network may comprise a resistor connected between the gate electrode of the IGFET and the first electrode of the power semiconductor device and a capacitor connected between the gate electrode of the IGFET and the second electrode of the power semiconductor device.

This has the advantage that the minimum step or change in the voltage at the first electrode of the power semiconductor device required to initiate dV/dt clamping is of the order of the threshold voltage of the IGFET and only requires that the voltage at the first electrode be a few times the threshold voltage of the IGFET to initiate turn on of the power semiconductor device when the predetermined limit of the rate of change of this voltage is reached.

The further insulated gate field effect device may comprise in addition to the further auxiliary device of the first example given above an insulated gate field effect transistor (IGFET) of the opposite conductivity type to the power semiconductor device connected between the insulated gate of the further auxiliary semiconductor device and the first electrode of the power semiconductor device. In this case, the RC network may comprise a resistor connected between the gate electrode of the IGFET and the first electrode of the power semiconductor device and a capacitor connected between the gate electrode of the IGFET and the second electrode of the power semiconductor device. This should reduce the high voltage withstanding capability which would otherwise be required of the IGFET of the second example given above were used, although it will require a higher voltage at the first electrode of the power semiconductor device before the power semiconductor device is caused to be switched on when the predetermined limit is reached.

BRIEF DESCRIPTION OF THE DRAWINGS

Embodiments of the invention will now be described, by way of example, with reference to the accompanying drawings, in which:

FIG. 3s a cross-sectional view through part of the semiconductor body for illustrating the structure of various components of the overvoltage protected switch shown in FIG. 1, and FIGS. 4 to 6 are circuit diagrams of various modified versions of the overvoltage protected switch shown in FIG. 1.

Figure 2:
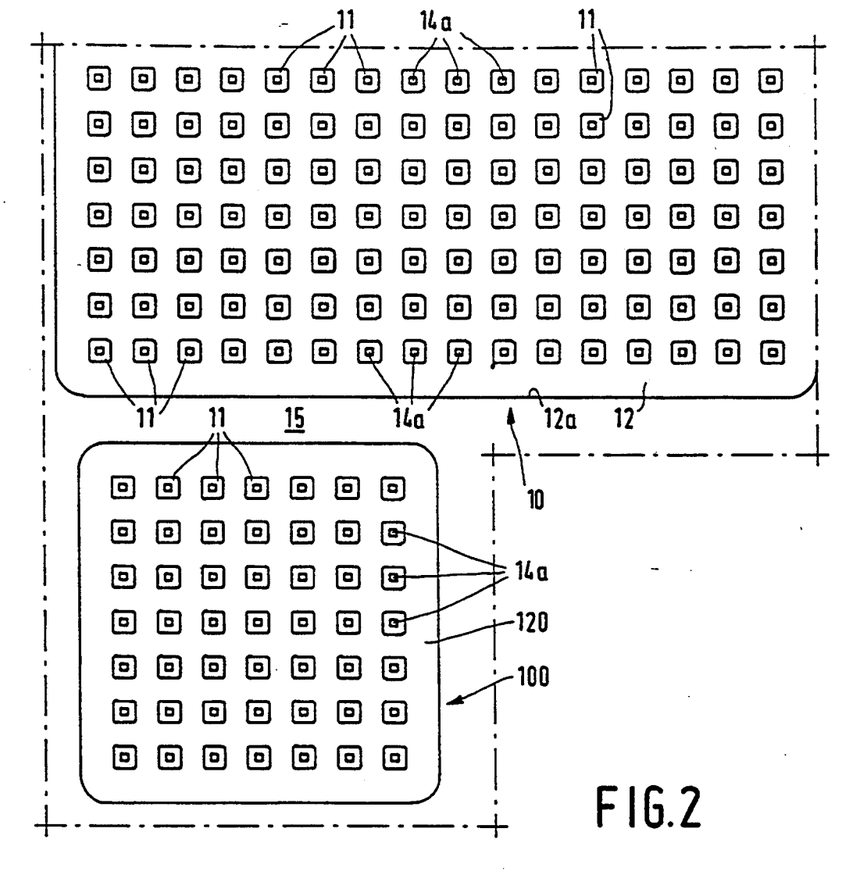
FIG. 2 is a plan view of part of a semiconductor body within which the overvoltage protected switch shown in FIG. 1 is integrated showing part of a power semiconductor device and an auxiliary semiconductor device.
Figure 3:
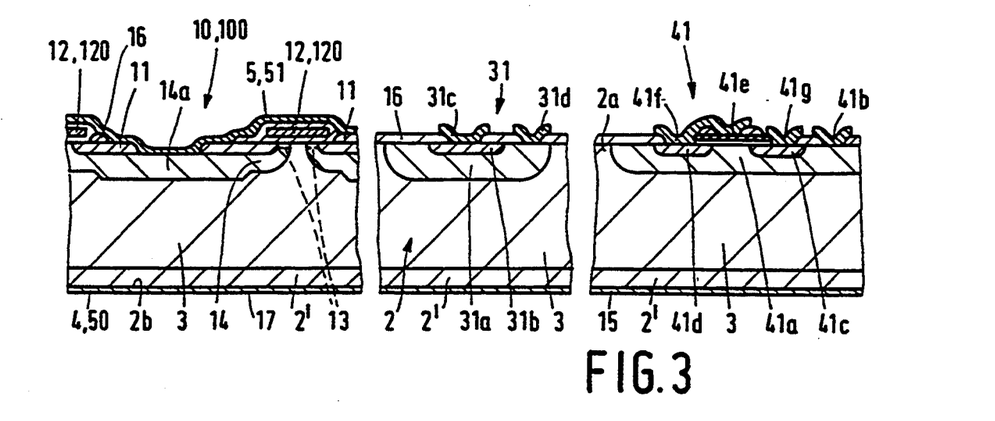

It should be understood that FIGS. 2 and 3 are merely schematic and are not drawn to scale. In particular certain dimensions such as the thickness of layers or regions may have been exaggerated whilst other dimensions may have been reduced. It should also be understood that the same reference numerals are used throughout the Figures to indicate the same or similar parts.

DETAILED DESCRIPTION OF THE PREFERRED EMBODIMENTS

Referring now to the drawings, there is illustrated an overvoltage protected semiconductor switch 1 (see for example FIG. 1) comprising a semiconductor body 2 (FIGS. 2 and 3) having a first region 3 of one conductivity type adjacent one major surface 2a, a power semiconductor device 10 comprising a plurality of second regions 11 formed within the first region 3, an insulated gate 12 overlying a conduction channel region 13 between each second region 11 and the first region 3 with the first and second regions 3 and 11 providing a conductive path to first and second main electrodes 4 and 5, respectively, of the switch 1, and protective means 20 for applying a signal to the insulated gate 12 of the power semiconductor device 10 to turn the power semiconductor device 10 on when a voltage exceeding a predetermined value is present on the first main electrode 4. In accordance with the invention, the protective means 20 comprises an auxiliary semiconductor device 100 comprising a number of further second regions 11, less than the plurality of second regions 11, formed within the first region 3, a further insulated gate 120 overlying a further conduction channel region 13 between each further second region 11 and the first region 3, a further conductive path connecting the further second regions 11 to the insulated gate 12 of the power semiconductor device 10 and diode means 30 connecting the insulated gate 120 of the auxiliary semiconductor device 100 to the first main electrode 4 for causing the auxiliary semiconductor device 100 to conduct to supply a signal via the further inductive path to the insulated gate 12 of the power semiconductor device to switch the power semiconductor device 12 on when the voltage on the first main electrode 4 exceeds the predetermined value.

Thus, in a protected switch 1 in accordance with the invention, an auxiliary semiconductor device 100 which is formed at the same time as the power semiconductor device 10 by a number of the same type of cells or second regions 11 used in the power semiconductor device is used to provide the protective means 20 which causes the power semiconductor device 10 to be switched on when an overvoltage occurs on the first main electrode 4. Because the auxiliary semiconductor device 100 is formed of cells comprising second regions 11 similar to the power semiconductor device 10, it has a large current-handling capability. Accordingly when an overvoltage occurs on the first main electrode 4, the auxiliary semiconductor device 100 can supply a large current to the insulated gate 12 of the power semiconductor device 10 enabling the voltage on the insulated gate 12 to be raised quickly so ensuring that the power semiconductor device 10 is rapidly turned on in the event of such an overvoltage so as to avoid the possibility of avalanche-stress induced failure. The diode means 30 are used to effect turn on of the auxiliary semiconductor device 100 and do not need to have a large current-handling capability as the main current supply to the insulated gate of the power semiconductor device is by means of the auxiliary semiconductor device 100 once it has been turned on by avalanching of the diode means 30.

Figure 1:
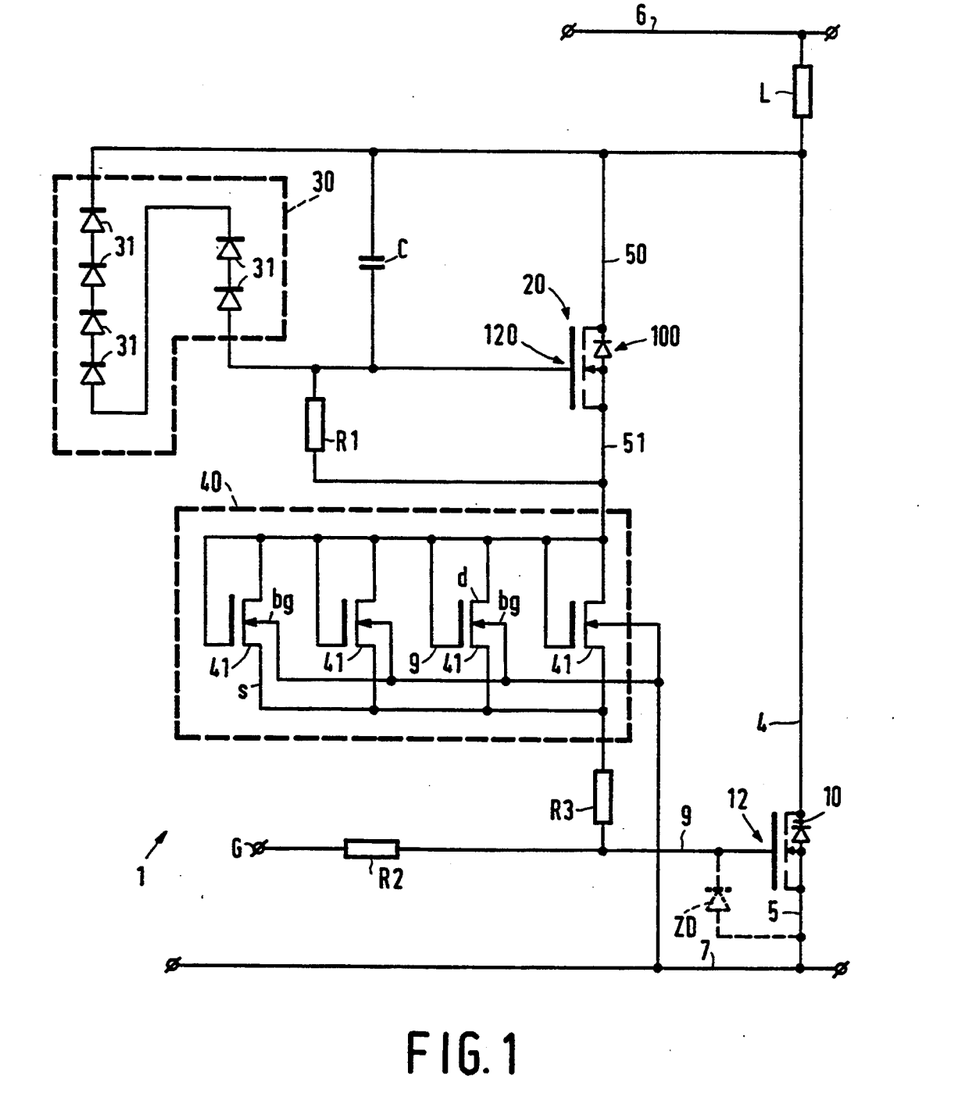
FIG. 1 is a circuit diagram of one example of an overvoltage protected switch in accordance with the invention.

Referring now specifically to the drawings, FIG. 1 illustrates the circuit diagram of one example of an overvoltage protected switch 1 in accordance with the invention.

In this example, the power semiconductor device 10 comprises an n-channel power MOSFET having its first main electrode, in this case the drain electrode, 4 connected via a load L to a positive voltage supply line 6. The second main electrode, in this case the source electrode, 5 is connected to a negative supply line 7 which may be, for example, earthed or grounded. The power semiconductor device 10 thus forms a low-side switch. The load L is represented schematically as a resistor and may be any load capable of being switched on and off by a power semiconductor device such as a power MOSFET; for example the load may be an electric light or lamp.

As will be described in more detail below, the auxiliary semiconductor device 100 has a similar structure to the power semiconductor device 10 and is in this example also an n-channel MOSFET but has, as will be explained below, many fewer source cells than power semiconductor device 10.

A first main electrode, in this case the drain electrode, 50 of the auxiliary MOSFET 100 is connected to the drain electrode 4 of the power MOSFET 10. The insulated gate of the auxiliary MOSFET 10 is connected via the diode means 30 to the drain electrode 4 of the power MOSFET 10. In this example, the diode means 30 comprises a series of diffused zener diodes 31 which may, as will be described below, be formed with the MOSFETs 10 and 100 so that no additional mask steps are necessary.

Although only six series-connected zener diodes 31 are shown, it will of course be appreciated that the number of diodes and their avalanche or breakdown voltages will depend on the characteristics of the diode structures, the particular circuit and the characteristics of the MOSFETS 10 and 100. To give an example there may be eight series-connected zener diodes 31 (of which, of course, only six are shown in FIG. 1) each having a breakdown voltage of around 6.8 volts.

As one possible alternative, the diode means 30 could comprise polycrystalline silicon diodes provided on top of the semiconductor body 2 because the majority of the current required to turn on the power MOSFET 10 quickly will be supplied via the auxiliary MOSFET 100. As a further alternative the diode means 30 could be provided by a series of diode-connected insulated gate field effect transistors (IGFETs).

A capacitor C is generally connected between the drain electrode 4 of the power MOSFET 10 and the insulated gate 120 of the auxiliary MOSFET 100, in parallel with the diode means 30 to provide an initial flow of current to the insulated gate 120 of the auxiliary semiconductor device 100 when the voltage at the first main electrode 4 starts to rise rapidly but has not yet reached the avalanche voltage of the diode means. Such an arrangement should increase the speed of turn on of the auxiliary semiconductor device 100 and thus also the speed of turn on of the power semiconductor 10. The insulated gate 120 of the auxiliary MOSFET 100 is also connected via a resistor R1 to its second main electrode 51, the source electrode in this case. The value of the resistor R1 will of course depend on the characteristics required but may be, for example, 500 ohms.

The source electrode 51 of the auxiliary power MOSFET 100 is connected via the further conductive path to the insulated gate 12 of the power MOSFET 10. The further conductive path includes further diode means 40 which serve to inhibit conduction in the reverse direction, that is from the insulated gate 12 of the power MOSFET 10 to the auxiliary semiconductor device 100, so as to ensure that the power MOSFET 10 responds rapidly to a conventional gate turn on signal supplied to the insulated gate 12 from a gate input terminal G via a resistor R2, typically of 200 ohms in value, and a gate supply line 9.

The further diode means 40 may comprise a further series or chain of zener diodes similar to zener diodes 31. However, in this example, the further diode means 40 comprises a diode-connected insulated gate field effect device. In particular, the further diode means 40 comprises a number, as shown four, of parallel-connected n-channel insulated gate field effect transistors (IGFETs) 41 formed, as will be described below, in the semiconductor body 2. The use of a number of diode-connected IGFETs 41 arranged in parallel enables a high current to be supplied via the further conductive path to the insulated gate of the power MOSFET 10 when the auxiliary MOSFET 100 has been switched on. As will be appreciated by those skilled in the art, all three components 10, 100 and 40 comprise insulated gate field effect transistors and the abbreviation MOSFET has been used for the power and auxiliary semiconductor devices merely because this is the terminology generally adopted in the art.

As shown in FIG. 1, the back gates bg of the IGFETs 41 are connected to the negative power supply line 7 which is in this example earthed. The back gates could however be connected to their respective sources in conventional manner although this would result, as is known, in a variation in their threshold voltage which might require some adjustment of the device characteristics. In this example each of the n-channel IGFETs 41 is a lateral n-channel IGFET having, typically, a length of seven μm (micrometers) and a width of 250 μm, although of course these parameters will depend on the desired characteristics and may be varied in dependence on the desired characteristics and, of course, the number of parallel-connected IGFETs 41.

The drain electrodes d of the IGFETs 41, in addition to being connected to their respective gates g, are connected to the source electrode 51 of the auxiliary MOSFET 100 while the source electrodes s of the IGFETs 41 are connected together and to the gate supply line 9 and thus to the insulated gate 12 of the power MOSFET 10. A small value, typically 50 ohms, resistor R3 may be provided between the source electrodes s of the IGFETs 41 and the gate supply line 9.

Another zener diode ZD, may be provided between the insulated gate 12 and source electrode 5 of the power MOSFET so as to enable the voltage on the insulated gate 12 to fall below the source voltage without turning on any parasitic bipolar within the power MOSFET 10.

FIG. 2 illustrates a top plan view of part of the semiconductor body 2 within which the power MOSFET 10 and the auxiliary MOSFET 100 are formed while FIG. 3 illustrates a cross-sectional view through part of the semiconductor body 2.

In order to show the structure of the MOSFETs 10 and 100 source, gate and interconnection metallisation have been omitted in FIG. 2. As can be seen clearly from FIG. 2 the power MOSFET 10 comprises a plurality of source cells each of which comprises a second or source region 11 and a conduction channel region 13 (see FIG. 3) over which the insulated gate 12 extends. As will be explained below the conduction channel region 13 is defined between the source region 11 and a surrounding third region 14. A relatively highly doped central region 14a of each third region extends up to the surface 2a within the associated source region 11 to enable the source region 11 to be shorted to the third region 14 to inhibit parasitic bipolar action. Typically the power MOSFET 10 may consist of many hundreds of thousands of source cells. The periphery 12a of the insulated gate 12 may extend up onto field oxide 15 surrounding the edge of the power MOSFET 10 in conventional manner and, although not shown, conventional edge termination such as Kao's rings and/or field plates may be provided at the periphery of the power MOSFET 10.

The auxiliary semiconductor device 100 effectively comprises a much smaller version of the power MOSFET 10. In this example, as shown, the auxiliary semiconductor device comprises 49 source cells each formed by a second or source region 11, and a conduction channel 13 (see FIG. 3) over which the insulated gate 120 extends. Again a central region 14a of a third region 14 extends to the surface 2a within the source cell so as to enable shorting of the source to the third region 14 to avoid parasitic bipolar action. The number of source cells forming the auxiliary semiconductor device 10 will of course depend on the desired characteristics and could be more or less than shown. Of course although increasing the number of source cells of the auxiliary semiconductor device 100 would increase its current handling capability it would also increase the area occupied by the auxiliary MOSFET 100.

FIG. 3 illustrates by way of a cross-section through the semiconductor body 2 a typical structure for the source cells of the MOSFETs 11 and 110, the zener diodes 31 and the lateral n-channel IGFETs 41. It will be appreciated that only one zener diode 31 and one IGFET 41 are shown in FIG. 3 because the structures of all the zener diodes 31 and all the IGFETs 41 will be similar. In addition, because the structures of the source cells of the power MOSFET 10 and the auxiliary MOSFET 100 are also similar only one cross-section is shown.

In the example of FIG. 3, the semiconductor body 2 comprises a relatively high doped n conductivity type monocrystalline silicon substrate 2' onto which is provided a relatively lowly doped n conductivity type epitaxial layer which forms the first region 3. The relatively highly doped substrate 2' provides a drain contact region which makes ohmic contact to metallisation 17 on the other major surface 2b of the semiconductor body 2. The metallisation 17 forms at least part of the drain electrodes 4 and 50 of the power MOSFET 10 and the auxiliary MOSFET 100.

As indicated above, each source cell of the power MOSFET 10 and of the auxiliary MOSFET 100 comprises a third region 14 of the opposite conductivity type which together with the source region 11 defines the conduction channel region 13. Each third region 14 has a relatively deep relatively highly doped central region 14a to enable shorting of the source region 11 to the third region 14 to inhibit parasitic bipolar action.

As shown in FIG. 3, each zener diode 31 may comprise a relatively deep, relatively highly doped region 31a of the opposite conductivity type formed using an appropriate mask with the central regions 14a and a relatively highly doped region 31b which may be formed, using an appropriate mask, with the source regions 11. Electrodes 31c and 31d make contact to the regions 31a and 31b, respectively to enable connection of the zener diodes 31 in the manner described above and shown in FIG. 1.

Each lateral n-channel IGFET 41 may have the structure shown in FIG. 3 where the n-channel IGFET is formed in a relatively lowly doped p conductivity type isolation well 41a having a surface dopant concentration of the order of $2-3 \times 10^{12}$ atoms cm$^{-2}$ which is connected to the second supply line 7 (generally earth) via an electrode 41b. The source and drain regions 41c and 41d of the IGFET 41 may be formed with the source regions 11.

In manufacture of the structure shown in FIG. 3, the insulated gates 12 of the MOSFETs 10 and 100 and the insulated gates 41e of the IGFETs 41 are first defined. Generally these will comprise a thermal gate oxide layer followed by a doped polycrystalline silicon layer. Impurities for forming the relatively deep relatively highly doped regions 14a and 31a may then be introduced, with if necessary an appropriate mask for the regions 31a, with the mask used to define the insulated gates still in place. This mask will overhang the insulated gates so that the central regions 14a will be spaced from the insulated gates. After removal of this mask, impurities for forming the remainder of the third region 14 are introduced with the areas in which these regions 14 are not required masked. After removal of this mask, a further mask is provided to allow introduction of the impurities to form the source regions 11, regions 31b of the zener diodes 31 and the source and drain regions 41c and 41d of the IGFETs 41. As will be appreciated by those skilled in the art, in respect of the MOSFETs 10 and 100, the inoculated gates 12 and 120 respectively form the mask so that the regions 11 and 14 are autoaligned to the insulated gates 12, 120. A central area of each source region 11 may be masked during the implantation process or may be subsequently etched away as shown in FIG. 3 to allow the source metallisation 5, 51 to contact the central regions 14a. An insulating layer 16 is then provided and contact holes opened to enable metallisation to be deposited and defined to provide the source electrodes 5,51 and gate electrodes (not shown) of the MOSFETs 10 and 100, the electrodes 31c and 31d of the zener diodes and electrodes 41f and 41g contacting the insulated gate 41e and drain region 41d of the IGFETs 41 and the source region 41c of the IGFETs 41, respectively. The metallisation 17 is also provided on the other major surface 2b to form the drain electrodes 5,50. The various resistors shown in FIG. 1 may be diffused or doped polycrystalline silicon resistors formed in conventional manner.

In operation of the circuit 1 shown in FIG. 1, when a voltage above the predetermined value is present at the drain electrode 4, for example when an inductive load is switched off, the zener diode chain 30 will detect the high voltage and will go into avalanche providing an avalanche current to the insulated gate 12 of the auxiliary MOSFET 100 thereby raising its gate voltage and so switching on the auxiliary MOSFET 100. The MOSFET 100 then supplies a relatively large current to the insulated gate 12 of the power MOSFET 10 via the further conductive path including the parallel arrangement of diode-connected IGFETs 41. The high current-carrying capability of the auxiliary MOSFET 100 and the parallel arrangement 40 of diode-connected IGFETs 41 ensures that the gate voltage of the power MOSFET 10 rises rapidly to switch on the power MOSFET 10 to allow energy to be dissipated by conduction of the power MOSFET 10 rather than by avalanche breakdown. Potentially damaging high voltage spikes on the drain electrode 4 can thus be absorbed. The voltage stress caused by the overvoltage is handled first by the auxiliary semiconductor device 100 and then by the power semiconductor device 10 when it is turned on. The diode means 30 serves only to detect the high voltage condition and does not have to carry the high charging current necessary to switch on the power MOSFET 10. This arrangement provides a significant increase in the ruggedness of the power semiconductor device 10 at a very low cost in terms of silicon area occupied by the protection means.

The protective means should also act to switch the power MOSFET 10 on if the rate of change with time of the voltage dV/dt across the power MOSFET 10 exceeds a given limit. Thus, the auxiliary MOSFET 100 will be switched on causing the power MOSFET 10 to conduct if the rate of change dV/dt tries to exceed $V_{gs}/r_1c$ where Vgs is the gate source voltage of the auxiliary MOSFET 100, $r_1$ is the resistance of the resistor R1 and c is the capacitances of the capacitor C. The actual value of the rate of the change dV/dt at which the power MOSFET 10 is switched can be determined by appropriate selection of the values of the capacitor C and the resistor R1. Where the auxiliary MOSFET 100 has 50 or 100 cells then the resistor R1 may, typically, have a value of 50 k (Kilo ohms). The capacitance of the capacitor C should be much greater than that of the zener diodes 31 and greater than the parasitic Miller capacitances of the auxiliary MOSFET 100.

Figure 4:
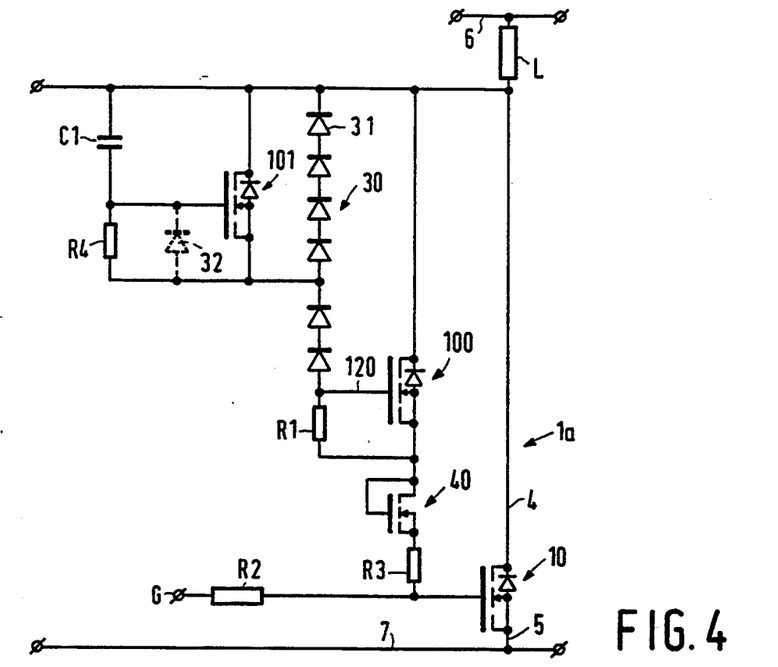

FIG. 4 is a circuit diagram of a first modified version 1a of the protected switch shown in FIG. 1.

In the example illustrated in FIG. 4, a further auxiliary semiconductor device 101 is connected between the drain electrode 4 of the power MOSFET 10 and the gate electrode 120 of the auxiliary MOSFET 100. As shown, the further auxiliary semiconductor device 101 is connected in parallel with part of the zener diode chain of the diode means 30 so that, as illustrated, two of the zener diodes 31 are connected in series with the further auxiliary semiconductor device 101.

The further auxiliary semiconductor device 101 is again a MOSFET and is formed of a number of device cells 11 in the same manner as the power MOSFET 10 and the auxiliary MOSFET 100. However, whereas the power MOSFET 10 may consist of hundreds of thousands of parallel-connected cells 11 and the auxiliary MOSFET 100 may consist of 50 or 100 such cells 11, the further auxiliary MOSFET 101 consists of only a few, for example one to four or perhaps eight, such cells 11. A capacitor C1 (which replaces the capacitor C of the FIG. 1 arrangement) is connected between the gate and drain electrodes of the further auxiliary MOSFET 101 while a resistor R4 is connected between the gate and source electrodes of the further auxiliary MOSFET 101. A zener diode 32 having a structure similar to that of the zener diodes 31 may, as shown in phantom lines in FIG. 4, be connected in parallel with the resistor R4.

The resistor R4 may be formed as a relatively lowly doped p conductivity diffused resistor formed in an n-conductivity well connected to a reference potential and may, typically, have a value of about 10K (kilo ohms) while the resistor 21 may have a value of about 1K. The capacitor C1 should have a capacitance much greater than the combined capacitance of the diode means 30 and the parasistic (Miller) capacitance of the further auxiliary MOSFET 101. Typically, the capacitor C1 may have a value of 5 pf (picofarads). The minimum step or change in the drain to source voltage (that is in pactice the change in the voltage at the drain) of the power MOSFET 10 necessary to initiate, in succession, conduction of the further auxiliary MOSFET 101, the auxiliary MOSFET 100 and the power MOSFET 10 and so to cause dV/dt clamping is given by the sum of the gate-source voltages of the MOSFETs 10, 100 and 101 and the gate source voltage of the further diode means 40 (the effect of resistors R3 and R2 in this regard being negligible).

In contrast the dV/dt clamping provided by the auxiliary MOSFET 100 and its feedback capacitance (plus capacitor C) and the capacitance of the diode means 30 in the circuit 1 of FIG. 1 requires a minimum drain voltage at the power MOSFET of the sum of the gate source voltages of the power MOSFET 10 and the further diode means 40 plus the gate-source voltage of the auxiliary MOSFET 100 multiplied by the factor $(1+C_{100}/C_{30})$ where $C_{100}$ is the feedback or parasitic capacitance of the auxiliary MOSFET 10 and $C_{30}$ is that of the diode means 30. Typically $C_{100}/C_{30}$ will be in the region of between 4 and 10 and, because of the large number of cells forming the auxiliary MOSFET 10, the additional capacitance C shown in FIG. 1 would need to be very large in order to reduce this multiplication factor significantly. Accordingly, in comparison to the example shown in FIG. 1, the circuit 1a shown in FIG. 4 should allow dV/dt clamping for smaller steps in the drain voltage of the power MOSFET 10. Also, because the resistor R1 does not need to have a very high value and can be about for example 1K, then the drain voltage step required for the circuit of FIG. 4 to provide for dV/dt clamping or limiting should be considerably more independent of the selected dV/dt limit (where the resistor R1 has a high value, the minimum drain voltage step for clamping to be initiated increases with increase in the selected dV/dt limit value).

As illustrated in FIG. 4, a zener diode 32 may be provided in parallel with the resistor R4. Thus should serve to prevent large negative gate source voltages being applied to the further auxiliary MOSFET 101 during a negative (fall) change with time i the drain voltage of the power MOSFET, which is not limited by the circuit. Of course, the effective additional capacitance of this component needs to be taken into account.

Figure 5:
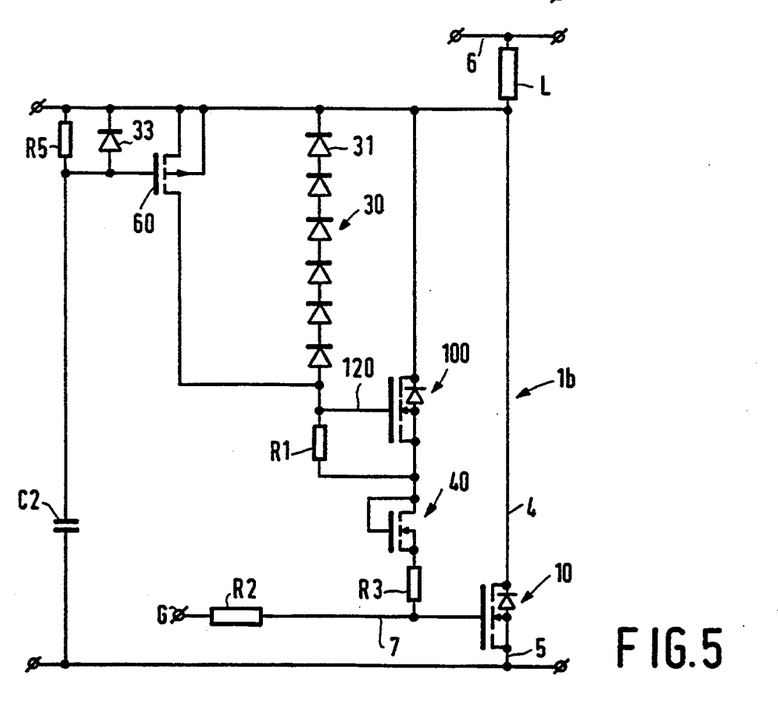

FIG. 5 illustrates another modified version 1b of the circuit shown in FIG. 1. In this example, a p-channel enhancement mode IGFET 60 is provided in parallel with the diode means 30. A resistor R5 in parallel with a zener diode 33 is connected between the gate and source electrodes of the p-channel enhancement mode IGFET 60. A capacitance C2 is connected between the gate electrode of the IGFET 60 and the source electrode 5 of the power MOSFET 10. The p-channel IGFET, 60 which has its back gate connected to its source electrode, may be of similar construction, with the conductivity types reversed, to the n-channel enhancement mode IGFETs 41 but should be capable of withstanding high voltages. This can be achieved in known manner by the use of so-called RESURF regions and field plating techniques, see for example EP-A-294888 corresponding to U.S. Pat. Nos. 5,135,880 and 5,229,633. Again the zener diode 33 and resistor R5 may have similar structures to the zener diodes 31 and resistor R4 respectively (see FIG. 3).

The resistor R1 may be, typically, of 1-5K (Kilo ohms). In this circuit, the dV/dt limit is selected by the values of resistor R5 and capacitor C2. This circuit has the advantage that the minimum step or change in the drain voltage of the power MOSFET 10 required to initiate dV/dt clamping is of the order of the threshold voltage of the p-channel IGFET 60 and only requires that the drain voltage of the power MOSFET 10 be a few times the threshold voltage of the IGFET 60 to initiate dV/dt limiting.

Figure 6:
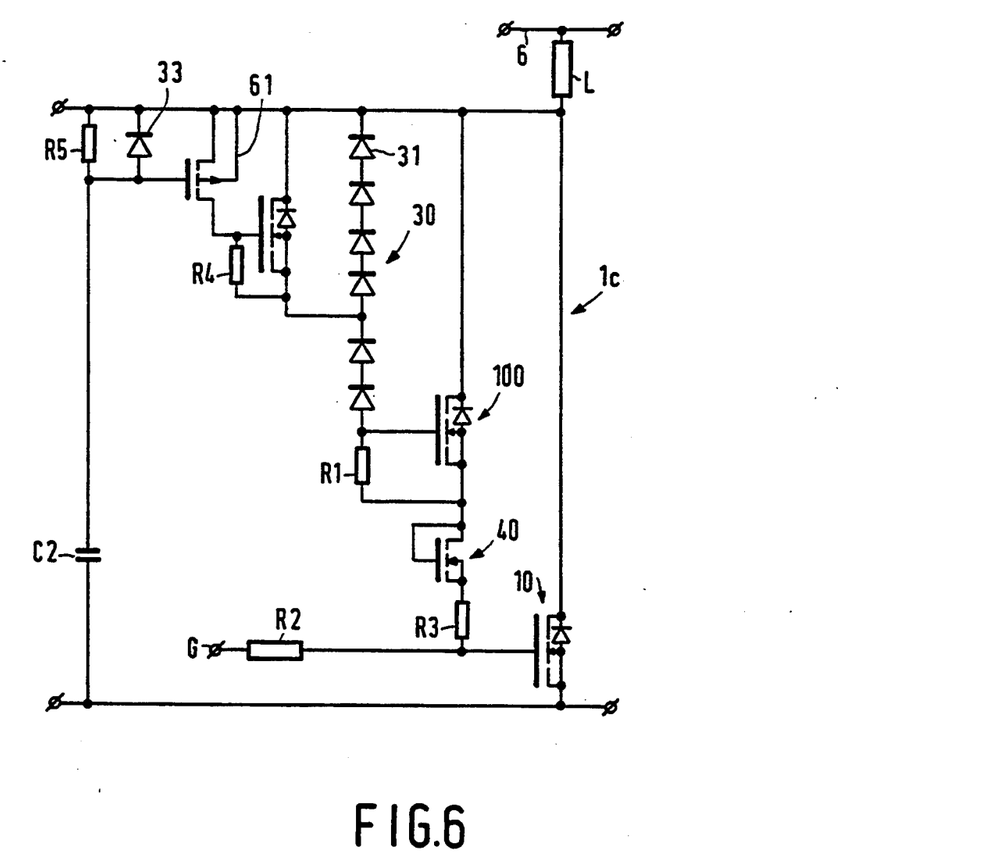

FIG. 6 illustrates a modified version 1c of the circuit 1b shown in FIG. 5. In effect, the circuit 1c of FIG. 6 combines the added features of the circuits of FIGS. 4 and 5. Thus, the circuit 1c of FIG. 6 is similar to that shown in FIG. 4 except that a p-channel IGFET 61, in parallel with resistor R5 and zener diode 33, is connected between the gate and drain electrodes of the further auxiliary MOSFET 101 in place of the capacitor C1 and the capacitor C2 is again connected between the gate electrode of the p-channel IGFET 61 and the source electrode of the power MOSFET 10. As will be appreciated this enables the p-channel IGFET 61 to be smaller than the p-channel IGFET 60 and reduces the voltage withstanding capability required while demanding a higher drain voltage for dV/dt limiting to be initiated.

Although in the examples described above the power semiconductor device and the auxiliary semiconductor device comprise power MOSFETs, other semiconductor devices could be used. Thus, for example, the power and auxiliary semiconductor devices could be insulated gate bipolar transistors (IGBTs) which may be formed by reversing the conductivity type of the substrate 2' (see FIG. 3) or by providing (by for example introduction of impurities into the surface 2b) local anode regions (p conductivity regions) extending through the substrate 2' in the areas of the power and auxiliary semiconductor devices 10 and 100.

Of course the conductivity types, and where appropriate the polarities, given above could be reversed. Also it is possible that the semiconductor devices 10 and 100 could be lateral rather than vertical devices. In addition it may be possible to use semiconductor materials other than or in addition to silicon.

From reading the present disclosure, other modifications and variations will be apparent to persons skilled in the art. Such modifications and variations may involve other features which are already known in the semiconductor and analogue MOS circuit design arts and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An overvoltage protected semiconductor switch including a semiconductor body, said semiconductor body comprising:

a first region of one conductivity type adjacent one major surface;

a vertical power semiconductor device including a plurality of second regions formed within the first region, a conduction channel region separating each second region from said first region, said power semiconductor device including first and second main electrodes on opposing major surfaces of said semiconductor body and an insulated gate overlying said conduction channel region between each second region and the first region to provide a gateable conduction channel between each second region and the first region with the first region and second regions providing respective conductive paths to the first and second main electrodes;

protective means for applying a signal to the insulated gate to turn on the power semiconductor device when a voltage exceeding a predetermined value is present on the first main electrode, said protective means including a vertical auxiliary semiconductor device having a plurality of further second regions formed within said first region, said plurality of further second regions being less than the plurality of said second regions of said power semiconductor device, a further conductive channel region separating each further second region from the first region, and a further insulated gate overlying said further conduction channel region between each further second region and the first region to provide a further gateable conduction channel between each further second region and the first region which provides a conductive path to said first main electrode, a further conductive path coupling the further second regions insulated gate of the power semiconductor device so that the first main electrode is connected to the insulated gate of the power semiconductor device via, in series, the further gateable conduction channel, the further conductive path and the first region; and diode means coupled between the further insulated gate of the auxiliary semi conductor device and the first main electrode for causing, when the voltage at the first main electrode exceeds the predetermined value, the auxiliary semiconductor device to conduct and to allow current to flow between the first main electrode and the insulated gate of the power semiconductor device via the further conduction channel and the further conductive path to switch the power semiconductor device on when the voltage at the first main electrode exceeds the predetermined value.

2. A switch according to claim 1, wherein the diode means includes a series of zener diodes coupled between the insulated gate of the auxiliary semiconductor device and the first main electrode.

3. A switch according to claim 2, further including a second zener diode coupled between the insulated gate and the second regions of the power semiconductor device.

4. A switch according to claim 2 wherein each second region is separated from the first region by a respective third region defining the conduction channel area, the third region being of opposite conductivity type to the second region, each third region and the associated second region defining therebetween a respective conduction channel region and each third region having a more highly doped deep central region which is more highly doped and deeper than the conduction channel region and is remote from the conduction channel region, and wherein each zener diode is formed between a region of the one conductivity type and a more highly doped deep region of the associated second region.

5. A switch according to claim 2 further including a capacitor connected between the first main electrode and the insulted gate of the auxiliary semiconductor device in parallel with the diode means.

6. A switch according to claim 5 further including another zener diode is provided between the insulated gate and the second regions of the power semiconductor device.

7. A switch according to claim 1, further including a capacitor coupled between the first main electrode and the insulated gate of the auxiliary semiconductor device in parallel with the diode means.

8. A switch according to claim 1, wherein the further conductive path includes further diode means connected between the further second regions and the insulated gate of the power semiconductor device for inhibiting conduction in the reverse direction from the insulated gate of the power semiconductor device to the auxiliary semiconductor device.

9. A switch according to claim 8, wherein the further diode means comprises a further series of zener diodes.

10. A switch according to claim 9 further including another zener diode is provided between the insulated gate and the second regions of the power semiconductor device.

11. A switch according to claim 8, wherein the further diode means includes diode-connected insulated gate field effect device.

12. A switch according to claim 11, wherein the diode-connected insulated gate field effect device includes a number of parallel-connected insulated gate field effect transistors formed within a well of the opposite conductivity type provided within the first region.

13. A switch according to claim 1, wherein each second region is separated from the first region by a respective third region defining the conductive channel area, the third regions being of opposite conductivity type to the second regions.

14. A switch according to claim 1, wherein the protective means further includes a further insulated gate field effect device connected between the gate electrode of the auxiliary semiconductor device and the first electrode of the power semiconductor device and RC network coupled between the first and second electrodes of the power semiconductor device for causing the further insulated gate field effect device to turn on when the rate of change of the voltage at the first electrode of the power semiconductor device exceeds a predetermined limit.

15. A switch according to claim 14, wherein the further insulated gate field effect device includes a further auxiliary semiconductor device comprising a number of additional second regions less than the number of further second regions of the auxiliary semiconductor device and an additional insulated gate overlying a conduction channel region between each additional second region and the first region and a conductive paths connecting the additional second regions to the further insulated gate of the auxiliary semiconductor device.

16. A switch according to claim 15, wherein the further insulated gate field effect device includes an insulated gate field effect transistor (IGFET) of the opposite conductivity type to the power semiconductor device connected between the insulated gate of the further auxiliary semiconductor device and the first electrode of the power semiconductor device, and the RC network includes a resistor connected between the gate and source electrode of the IGFET and the first electrode of the power semiconductor device and a capacitor connected between the gate electrode of the IGFET and the second electrode of the power semiconductor device.

17. A switch according to claim 14, wherein the further insulated gate field effect device comprises an insulated gate field effect transistor (IGFET) of the opposite conductivity type to the power semiconductor device and the RC network includes a resistor connected between the gate electrode of the IGFET and the first electrode of the power semiconductor device and a capacitor connected between the gate electrode of the IGFET and the second electrode of the power semiconductor device.

18. A switch according to claim 14, wherein the further insulated gate field effect device includes an insulated gate field effect transistor (IGFET) of the opposite conductivity type to the power semiconductor device connected between the insulated gate of the further auxiliary semiconductor device and the first electrode of the power semiconductor device, and the RC network includes a resistor connected between the gate and source electrode of the IGFET and the first electrode of the power semiconductor device and a capacitor connected between the gate electrode of the IGFET and the second electrode of the power semiconductor device.

* * * * *